United States Patent
Bremner (10) Patent No.: US 9,627,044 B2
(45) Date of Patent: Apr. 18, 2017

(54) OFFSET DETECTION

(71) Applicant: SURECORE LIMITED, Leeds (GB)

(72) Inventor: Duncan James Bremner, Leeds (GB)

(73) Assignee: SURECORE LIMITED, Leeds (GB)

( * ) Notice: Subject to any disclaimer, the term of this patent is extended or adjusted under 35 U.S.C. 154(b) by 0 days.

(21) Appl. No.: 15/107,478

(22) PCT Filed: Dec. 15, 2014

(86) PCT No.: PCT/GB2014/053700
§ 371 (c)(1),
(2) Date: Jun. 23, 2016

(87) PCT Pub. No.: WO2015/097436
PCT Pub. Date: Jul. 2, 2015

(65) Prior Publication Data
US 2016/0322099 A1    Nov. 3, 2016

(30) Foreign Application Priority Data

Dec. 23, 2013   (GB) .................................. 1322848.1

(51) Int. Cl.
*G11C 11/00* (2006.01)
*G11C 11/419* (2006.01)
(Continued)

(52) U.S. Cl.
CPC .......... *G11C 11/419* (2013.01); *G11C 11/418* (2013.01); *G11C 29/026* (2013.01); *G11C 11/415* (2013.01); *G11C 29/023* (2013.01)

(58) Field of Classification Search
CPC ... G11C 11/419; G11C 11/418; G11C 29/026; G11C 11/415; G11C 29/023
(Continued)

(56) References Cited

U.S. PATENT DOCUMENTS 5,896,332 A    4/1999   Brauch
7,633,791 B2 *  12/2009  Kim ..................... G11C 11/4076
                                                          365/149
(Continued)

FOREIGN PATENT DOCUMENTS

EP          2439744 A2     4/2012

OTHER PUBLICATIONS

Search Report of the GB Intellectual Property Office for Application No. GB 1322848.1, mailed Feb. 19, 2014, 5 pages.
(Continued)

*Primary Examiner* — Fernando Hidalgo
(74) *Attorney, Agent, or Firm* — Meunier Carlin & Curfman LLC (57) ABSTRACT

There is provided a method of detecting offset in a sense amplifier of an SRAM memory unit. The method comprises using a sense amplifier of the SRAM memory unit to implement a read of a first data value stored in a memory cell of the SRAM memory unit, and measuring a first time for the sense amplifier to read the first data value. The method further comprises using the sense amplifier to implement a read of a second data value stored in a memory cell of the SRAM memory unit, and measuring a second time for the sense amplifier to read the second data value. The method then comprises calculating a difference between the first time and the second time, and determining whether an offset adjustment should be applied to the sense amplifier in dependence upon the difference between the first time and the second time.

20 Claims, 5 Drawing Sheets (51) Int. Cl.
*G11C 11/418* (2006.01)
*G11C 11/415* (2006.01)
*G11C 29/02* (2006.01)

(58) Field of Classification Search
USPC ......... 365/154, 185.21, 185.22, 185.23, 129,
365/189.011, 189.15, 205, 204, 207, 208
See application file for complete search history.

(56) References Cited

U.S. PATENT DOCUMENTS

| | | | |
|---|---|---|---|
| 8,437,214 B2* | 5/2013 | Mikan | G11C 7/02 365/154 |
| 2003/0173998 A1 | 9/2003 | Terzioglu et al. | |
| 2003/0179644 A1 | 9/2003 | Anvar et al. | |
| 2004/0037139 A1 | 2/2004 | Shimizu | |
| 2004/0095827 A1 | 5/2004 | Perner et al. | |
| 2005/0013182 A1 | 1/2005 | Smith et al. | |
| 2009/0003108 A1 | 1/2009 | Somasekhar et al. | |
| 2011/0019493 A1 | 1/2011 | Ikeda et al. | |
| 2011/0140773 A1 | 6/2011 | Lee et al. | |
| 2012/0327730 A1 | 12/2012 | Chen et al. | |
| 2013/0058172 A1 | 3/2013 | Rao et al. | |

OTHER PUBLICATIONS

International Search Report and Written Opinion of the EP International Searching Authority for Application No. PCT/GB2014/053700, mailed Mar. 11, 2015, 10 pages.

International Preliminary Report on Patentability of the International Preliminary Examining Authority for Application No. PCT/GB2014/053700, mailed Apr. 11, 2016, 16 pages.

* cited by examiner

OFFSET DETECTION

The present invention relates to a method of and an apparatus for detecting offset in SRAM memory unit. In particular, the present invention provides a method of operating an SRAM memory unit in order to determine if an offset adjustment should be applied to a sense amplifier of the SRAM memory unit, and an apparatus for detecting offset in a sense amplifier of an SRAM memory unit.

Data storage is an essential requirement for virtually all modern digital electronic systems. Static read/write memory (SRAM) comprises a major part of that function, being relatively easy to integrate into a semiconductor device together with large amounts of logic, thus offering fast access and low power. With the advent of deep sub-micron (DSM) geometry silicon processing, the task of implementing reliable storage whilst simultaneously maintaining low power consumption becomes increasingly problematic, whilst conversely demand rises with the proliferation of battery-powered electronic gadgets requiring progressively larger memories.

Figure 1:
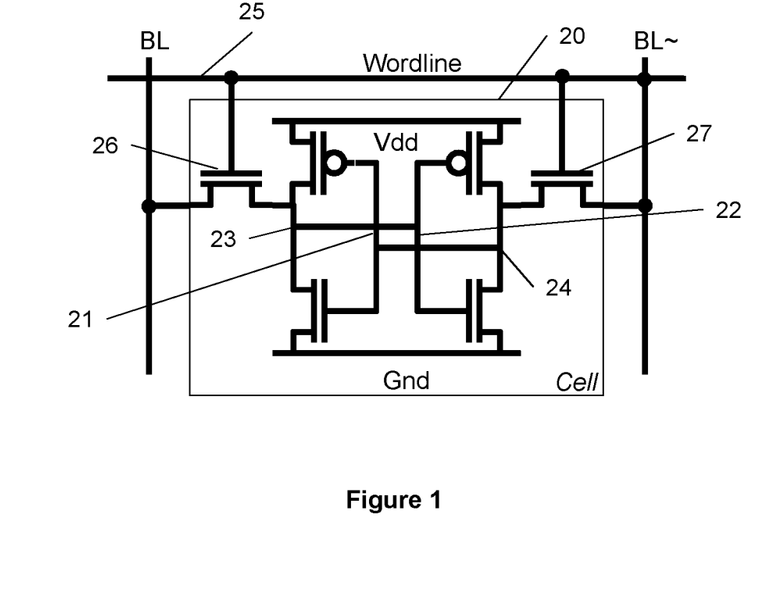
FIG. 1 illustrates a standard 6-transistor memory cell.

A common design of memory cell is the 6-transistor circuit shown in FIG. 1 and consists of a storage element made up of two back-to-back inverters 21, 22 with respective access transistors 26, 27 which are turned ON by means of a word line control 25 to form a conducting path between the data storage nodes 23, 24 of the cell 20 and the external bit lines (BL and BL~). Writing to the cell is achieved by forcing a high voltage onto one of the bit lines (BL or BL~) whilst simultaneously forcing a low voltage onto the other, and then driving the word line 25 high to activate the access path allowing the voltage levels held on the bit lines (BL and BL~) to overcome the state of the storage element. The word line 25 is then driven low to disconnect the memory cell 20 with its data store held in its new state.

Reading from the cell is achieved by initially driving both bit lines to a notionally high level before then driving the word line 25 high. One of either BL or BL~ will then be pulled low through the access devices by the low voltage side of the storage cell.

During read phase, the complementary bit lines are attached to inputs of a sense amplifier (not shown) that is part of the read circuitry which is used when data is read from the memory. A sense amplifier senses the low level signals present on the bit lines which represent the data value (i.e. either a '1' or a '0') stored in a given memory cell, and amplifies the small voltage swing to recognisable logic level so that the data can be interpreted properly by logic outside the memory. The difference in voltage levels between the two bit lines can therefore be sensed by the sense amplifier and used to determine the data value (i.e. '1' or '0'). The decision levels representing a '1' and a '0' will have been pre-determined during the circuit design phase and applied by the sense amplifier.

To minimise the area required to implement a memory unit, the same data lines (BL and BL~) are used to carry the data to the memory cell during a write operation. As described above for a write operation, the voltage on one or other of the bit lines (BL and BL~) (according to the required input data value) is driven low for the column in which the memory cell is located, and the word line controlling the row in which the memory cell is located is pulsed high for long enough to write the data into that cell. This enables users to write or read data to a unique cell across an array of cells in a memory block.

Figure 2:
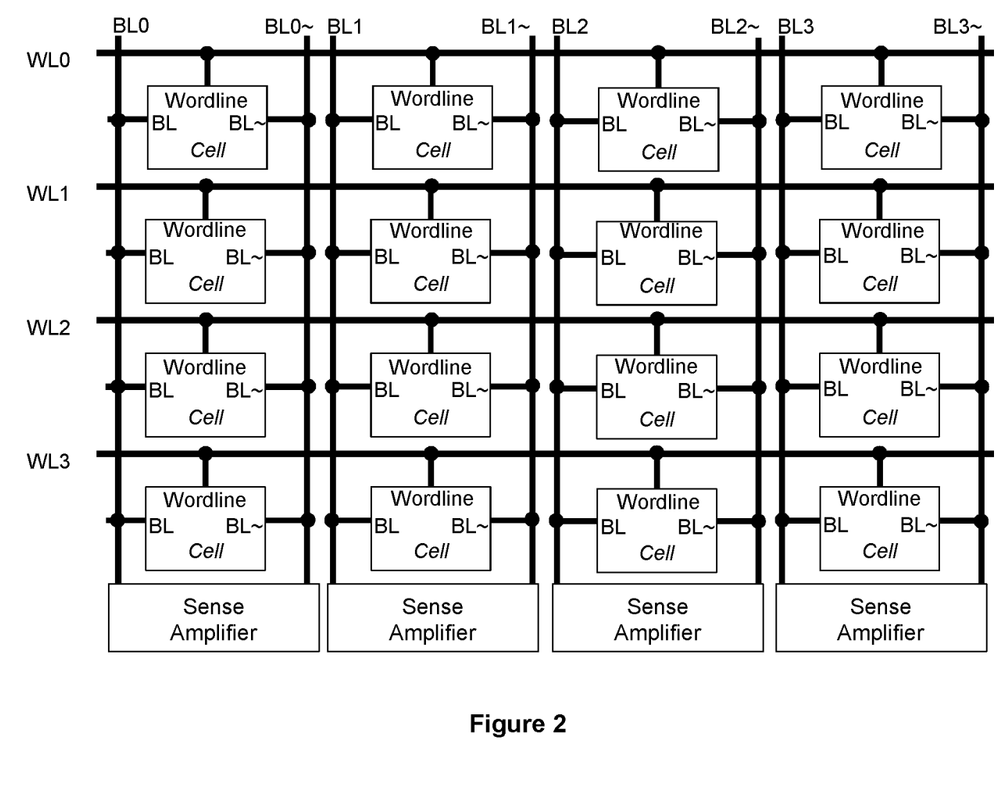
FIG. 2 illustrates a block of 6-transistor memory cells.

A block of memory constructed from traditional 6-transistor memory cells is shown in FIG. 2. The block illustrated in FIG. 2 contains an array of cells, with the word lines connected across the rows of the array and bit lines running along the columns. By convention the word lines are always said to run along the rows of an array of memory cells whilst the bit lines are always said to run down the columns of an array of memory cells, irrespective of the orientation of the array. A multiplex structure will often be provided at the bottom of the array for selecting which of the columns is to be accessed (for either read or write) according to a set of column select signals which are derived from the address supplied to the memory by the user. Typically, there is one sense amplifier for each column of memory block (as shown), such that there are number of identical sense amplifiers within each block. Initially before each memory read access, the bit lines for all columns are pre-charged into a 'known' high state (circuitry not shown).

For a read operation, the bit lines (BL and BL~) for the column in which the memory cell is located are both pulled high, while all the word lines are held low (this is commonly referred to as the bit line pre-charge part of the cycle). The word line controlling the row in which the cell is located is then pulled high. This turns on the memory cell access transistors in a single row of memory cells, and so connects all of the memory cells in that row to the associated bit lines. Each memory cell in the row therefore starts to pull one of the bit lines (either BL or BL~, depending on its stored data) low. Since the access transistors are relatively small, and the bit lines can have relatively high capacitance, the bit line voltage falls relatively slowly (compared with the speed of the silicon process). Sometime later, once a sufficient voltage difference has developed between BL and BL~, the voltage difference is measured and converted into a logical high or low (i.e. either a '1' or a '0') by a sense amplifier, and the word line is pulled low again. The bit lines are then pulled high again, ready for the next access.

As process technologies get smaller and the market drive for low power increases, the signal (charge) levels used to store the data in SRAM units have been reduced, and consequently the storage and correct detection of a data value (i.e. either a '1' or a '0') has become more difficult. Conventionally, SRAM circuit design involves developing a balance between the influence of different circuit blocks to ensure that the storage of data and the reading of that data is possible across a matrix of variable factors, including process, voltage, and temperature, whilst also ensuring the proper operation of the circuit. In this regard, as the relative pull-up /pull-down strengths of the back-to-back inverters within a memory cell inverter are reduced, and the size of the SRAM units get larger, the capacitive loading of the bit line can alter the state of a memory cell due to the dynamic loading that the large capacitance will place upon the memory cell. Consequently, there is an intrinsic trade-off between speed of charging the bit lines and the risk of changing the state of a memory cell due to capacitive loading that must be optimised when designing conventional SRAM units. However, as the dimensions of the manufacturing process have continued to shrink, and the effects of statistical variations in various circuit block performance has begun to dominate the performance SRAM memory units, the ability to adjust or compensate for these variations at the circuit design stage has become more complex.

Furthermore, as the signals stored in a memory cell become smaller, the effects of systemic or random offsets in the sense amplifier used to read the memory cell cause a non-symmetry in the storage capabilities of the memory (i.e. a mis-match of the Static Noise Margin(SNM) characteristics). Due to the digital nature of memory subsystems combined with necessarily simple control abilities implemented in the word line (WL) signals for space saving reasons, it is difficult to measure the presence of any offset in the sense amplifier, and it is therefore difficult to apply offset adjustment to the sense amplifier in order to improve the performance of the memory subsystem.

The present invention provides a method of operating an SRAM memory unit in order to determine if an offset adjustment should be applied to a sense amplifier of the SRAM memory unit.

Therefore, according to a first aspect there is provided a method of detecting offset in a sense amplifier of an SRAM memory unit. The method comprises using a sense amplifier of the SRAM memory unit to implement a read of a first data value stored in a memory cell of the SRAM memory unit, and measuring a first time for the sense amplifier to read the first data value. The method further comprises using the sense amplifier to implement a read of a second data value stored in a memory cell of the SRAM memory unit, and measuring a second time for the sense amplifier to read the second data value. The method then comprises calculating a difference between the first time and the second time, and determining whether an offset adjustment should be applied to the sense amplifier in dependence upon the difference between the first time and the second time. The first data value is any of a '1' and a '0' and the second data value is the other of a '1' and a '0'.

The step of using the sense amplifier to implement a read can comprise connecting the memory cell to be read to a pair of complementary bit lines, and using the sense amplifier to sense a voltage difference between the complementary bit lines. The first time and the second time can then be measured from the point at which the memory cell to be read is connected to the complementary bit lines.

The complementary bit lines may be connected to the memory cell to be read via respective access transistors that are activated by a word line. The complementary bit lines may comprise a first bit line and a second bit line, the first bit line being connected to a first storage node of the memory cell to be read via a first access transistor and the second bit line being connected to a second storage node of the memory cell to be read via a second access transistor.

The complementary bit lines may comprise a first local bit line and a second local bit line, the first and second local bit lines being operatively connected to the sense amplifier via respective first and second global bit lines, and the step of using the sense amplifier to sense a voltage difference between the complementary bit lines comprises applying voltages to the first and second global bit lines that correspond to voltages present on the first and second local bit lines respectively and using the sense amplifier to sense a voltage difference between first and second global bit lines.

The step of applying voltages corresponding to voltages present on the first and second local bit lines to the first and second global bit respectively may then comprise connecting the first and second local bit lines to the first and second global bit lines respectively. The first time and the second time can be measured from the point at which first and second local bit lines are connected to the first and second global bit lines.

The step of applying voltages corresponding to voltages present on the first and second local bit lines to the first and second global bit respectively may comprise using a local sense amplifier to sense a voltage difference between the first and second local bit lines and applying correlating/corresponding voltages to the first and second global bit lines. The first time and the second time can be measured from the point at which correlating/corresponding voltages are applied to the first and second global bit lines.

The SRAM memory unit may comprise a plurality of memory cells, a first subset of the plurality of memory cells being available to store data and a second subset of the plurality of memory cells being available to implement test read operations. The memory cell used to store the first data value and the memory cell used to store the second data value can then be part of the second subset. The first and second test read operations may be implemented when the SRAM memory unit is in a calibration mode.

The method may further comprise applying an offset adjustment to the sense amplifier. The SRAM memory unit may have a hierarchical bit line arrangement and the offset adjustment can then be applied to both the local sense amplifier associated with the memory cell used for the first and second test read operations and the global sense amplifier.

The step of determining that an offset adjustment should be applied to the sense amplifier in dependence upon the difference between the first time and the second time can comprise comparing the calculated difference with a threshold, and determining that an offset adjustment should be applied to the sense amplifier when the calculated difference exceeds the threshold. The threshold may be determined based on a minimum offset adjustment that can be applied to the sense amplifier.

The method may further comprise, when it is determined that an offset adjustment should be applied to the sense amplifier, determining the offset adjustment to be applied in dependence upon the magnitude of the calculated difference.

The method may further comprises, for each of two or more local sense amplifiers of the SRAM memory unit that are operatively connected to the sense amplifier, using the sense amplifier to implement a read of a first data value and a read of a second data value via the local sense amplifier and measuring a first time for the sense amplifier to read the first data value and a second time for the sense amplifier to read the second data value. The method may then comprise determining that an offset adjustment should be applied to the sense amplifier in dependence upon the difference between the first time and the second time measured for each of two or more local sense amplifiers.

The step of determining that an offset adjustment should be applied to the sense amplifier in dependence upon the difference between the first time and the second time measured for each of one or more local sense amplifiers may comprise using the time difference measured for each of two or more local sense amplifiers to determine a representative time difference and using the representative time difference to determine the offset adjustment to be applied. The representative time difference can be any of an average and a mean of the time difference measured for each of two or more local sense amplifiers.

According to a second aspect there is provided a method of operating an SRAM memory unit, the method being in accordance with the first aspect.

According to a third aspect there is provided an apparatus for detecting offset in a sense amplifier of an SRAM memory unit. The apparatus comprises a timer module configured to measure a first time for the sense amplifier to read a first data value stored in a memory cell of the SRAM memory unit, and to measure a second time for the sense amplifier to read a second data value stored in a memory cell of the SRAM memory unit. The apparatus further comprises a memory module configured to store the first time and the second time measured for the sense amplifier, and a detection module configured to calculate a difference between the first time and the second time; and to determine that an offset adjustment should be applied to the sense amplifier in dependence upon the difference between the first time and the second time.

The detection module may be configured to compare the calculated difference with a threshold, and to determine that an offset adjustment should be applied to the sense amplifier if the calculated difference exceeds the threshold.

The apparatus may further comprise an offset adjustment module configured to cause an offset adjustment to be applied to the sense amplifier. The offset adjustment module may be configured to determine the offset adjustment in dependence upon the magnitude of the calculated difference.

According to a fourth aspect there is provided a computer readable medium storing computer interpretable instructions which when interpreted by a programmable computer cause the computer to perform a method in accordance with the first aspect.

The present invention will now be more particularly described by way of example only with reference to the accompanying drawings, in which.

In order to at least mitigate the problems identified above there will now be described a method of detecting an offset in a sense amplifier of the SRAM memory unit, and thereby determine if an offset adjustment should be applied to a sense amplifier of the SRAM memory unit. This method involves measuring the time taken for the sense amplifier to validly read both a '1' and a '0' and determining that an offset adjustment should be applied to the sense amplifier if there is a significant difference between the times. In other words, after measuring the time taken for the sense amplifier to validly read both a '1' and a '0', from the difference between these times it can be determined whether an offset is present, and whether this offset is of sufficient magnitude to require correction. In this regard, at one time, the memory cells of the SRAM memory unit store a data value (i.e. the state of a memory cell represents a data value of either '1' or '0'), and the time taken by a sense amplifier to read both of these data values (i.e. the time to determine if a memory cell stores a 1 or 0) is measured and used as an indication of any offset of the sense amplifier.

By way of example, if we consider a simple SRAM memory unit such as that illustrated in FIG. 2, in which each memory cell is connected to a pair of complementary bit lines via respective access transistors, and these complementary bit lines are directly connected to a sense amplifier, then the time taken to read a data value that is stored in a memory call could be measured from the point at which the memory cell to be read is connected to the complementary bit lines.

Figure 3:
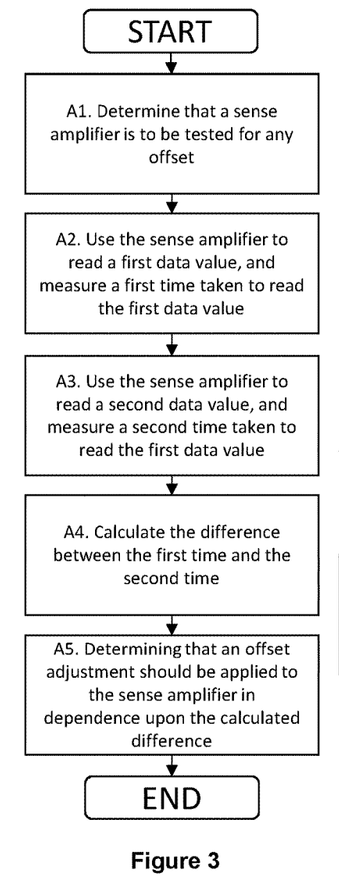
FIG. 3 is a flow diagram illustrating a process of determining if an offset adjustment should be applied to a sense amplifier of a SRAM memory unit.

FIG. 3 is a flow diagram illustrating the process of determining if an offset adjustment should be applied to a sense amplifier of a SRAM memory unit. The process includes the steps of:

A1. It is determined that a particular sense amplifier of the SRAM memory unit should be tested to determine whether an offset is present. This determination can be made, either autonomously, by using a stored programme control, or by some other means. During such a test the sense amplifier will typically be in an idle state and not delivering data for other functions.

A2. The sense amplifier of the SRAM memory unit is then used to implement a read of a first data value stored in a memory cell of the SRAM memory unit, and the time taken for the sense amplifier to validly read the first data value is measured (i.e. a first time). To do so, the memory cell storing the first data value is operatively connected to a pair of complementary bit lines (BL and BL~) and the sense amplifier senses the voltage difference between the complementary bit lines. The first data value is either of a '1' and a '0'.

A3. The sense amplifier is then used to implement a read of a second data value stored in a memory cell of the SRAM memory unit, and the time taken for the sense amplifier to validly read the second data value is measured (i.e. a second time). The memory cell storing the second data value can be the same as or different to that which stored the first data value provided that the sense amplifier being tested is used to measure both the first data value and the second data value. In order to read the second data value, the memory cell storing the second data value is operatively connected to a pair of complementary bit lines and the sense amplifier senses the voltage difference between the complementary bit lines. As the first data value is either of a '1' and a '0', the second data value is the other of a '1' and a '0'.

A4. Calculating a difference between the first time and the second time.

A5. Determining that an offset adjustment should be applied to the sense amplifier in dependence upon the difference between the first time and the second time.

In this regard, the times taken for a sense amplifier to read both a first data value and a second data value could be determined by implementing a number of read operations of one or more memory cells using the sense amplifier, measuring and storing the time taken by the sense amplifier to implement each read, and then using the stored times to compare a first time taken to read the first data value and a second time taken to read the second data value.

Alternatively, after it is determined that a particular sense amplifier of the SRAM memory unit should be tested, a memory cell that can be attached to the sense amplifier is identified and the storage of a first date value is established on the identified memory cell. In this regard, to establish the storage of a first date value, the storage state of the memory cell could be determined from a previous write command (i.e. it is known to be storing '1' or '0'), and this storage state would be used as the first date value. Alternatively, the first data value can be written to the memory cell for the purposes of the test.

Then, after the sense amplifier has validly read the first data value, the complementary second data value is established on a memory cell that can be attached to the sense amplifier. This can be the same memory cell as was used to implement a read of the first data value, or a different/further memory cell that can also be attached to the sense amplifier. Preferably, if a further memory cell is used to implement a read of the second data value, the further memory cell should be closely located to the memory cell that was used to implement a read of the first data value in order to ensure that, due to their proximity, the two memory cells, will exhibit comparable performance. Once again, in order to establish the storage of the second date value, the storage state of the memory cell could be determined from a previous write command (i.e. it is known to be storing the complementary '1' or '0'). Alternatively, the second data value can be written to the memory cell for the purposes of the test.

The decision whether or not to apply an adjustment could be determined in several ways. For example, the decision could be applied 'blindly' and the performance results of the applied offset compared in order to determine whether or not the offset adjustment has improved the performance of the sense amplifier. By way of example, depending upon the implementation, the detection of an offset may not indicate the direction of that offset. The offset adjustment applied to the sense amplifier would then be applied in an arbitrary direction. The subsequent performance of the sense amplifier would then be measured (i.e. the offset detection process would be repeated) and, if it is determined that the offset has worsened, a further offset adjustment would then be applied to the sense amplifier that is in the opposite direction to that of previous offset adjustment. Alternatively, the decision could be made using 'a priori' knowledge of the circuit performance and behaviour via calculation of the circuit performance via simulation, hand calculation, or other means to use a look-up table to decide whether application of an offset adjustment is beneficial.

Figure 4:
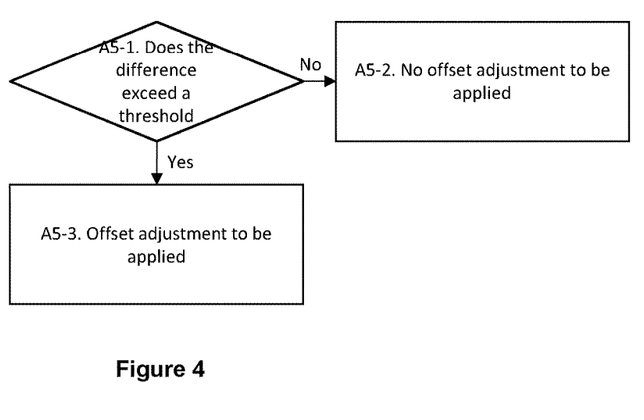
FIG. 4 is a flow diagram illustrating a portion of a process of determining if an offset adjustment should be applied to a sense amplifier of a SRAM memory unit.

As illustrated in the flow diagram of FIG. 4, step A5 preferably involves comparing the calculated difference with a threshold (A5-1). If the calculated difference does not exceed the threshold, then it is determined that no offset adjustment is to be applied to the sense amplifier (A5-2). If the calculated difference does exceed the threshold, then it is determined that an offset adjustment is to be applied to the sense amplifier (A5-3). In this regard, the threshold would preferably be determined based on the minimum offset adjustment that can be applied to the sense amplifier in order to avoid overcompensating for relatively small offsets, as doing so could potentially worsen the offset.

In addition, when it is determined that an offset adjustment should be applied to the sense amplifier, the magnitude of the calculated difference could be used determine the offset adjustment that should be applied. For example, determining whether the time taken to read a data value of '1' is shorter or longer than the time taken to read a data value of '0' provides an indication of the direction of the offset of the sense amplifier (i.e. whether it is positive or negative). In particular, the offset adjustment could be determined by using the calculated difference to perform a lookup in a lookup table, wherein the lookup table is populated with discrete offset adjustment values based on knowledge of the SRAM memory unit arrangement and/or test data obtained from the SRAM memory unit or an identical SRAM memory unit.

If it is determined that an offset adjustment should be applied to the sense amplifier, then an offset adjustment is applied accordingly. For example, this could involve switching an adjustment current or voltage (either positive or negative) into the input stage of the sense amplifier in with the aim of counteracting/cancelling out the offset one way or other. In this regard, if the design parameters and operation of the sense amplifier are known, then the adjustment current or voltage applied could cancel the offset in a variety of ways. In this regard, those skilled in the art would be aware of how to apply offset adjustment to a sense amplifier.

A common feature of some modern memories is the use of a hierarchical bit line arrangement in which, instead of a single bit line that runs the entire height/length of a column of memory cells and connects to each cell in the column, a multi-level structure is used. In a hierarchical bit line arrangement, each bit line (BL, BL~) is effectively broken up into multiple "local bit lines", with each of these local bit lines (LBL, LBL~) then being connected to memory cells in a different parts of the column. The local bit lines are then operatively connected to global bit lines (GBL, GBL~) via either a local sense amplifier or a pair of switches (i.e. a switch connecting each local bit line to the corresponding global bit line). The memory read and write circuits then connect to the global bit line, and not directly to the local bit line. During a memory access, only the local bit lines in the relevant part of the column is connected to the global bit line.

Figure 5:
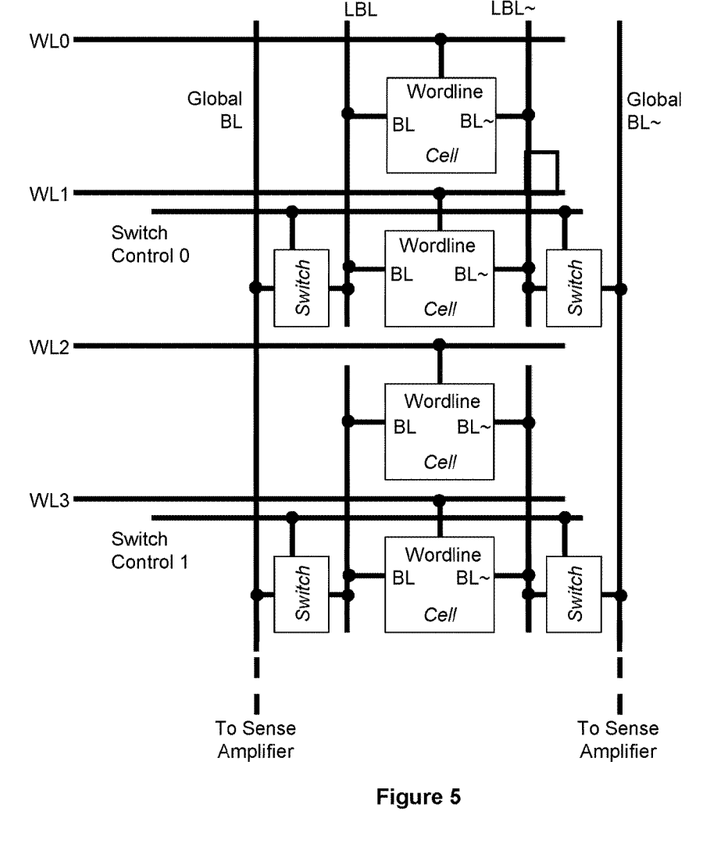
FIG. 5 illustrates schematically an example of an SRAM memory unit having a hierarchical bit line arrangement.

FIG. 5 illustrates schematically an example of an SRAM memory unit having a hierarchical bit line arrangement in which a single column of four memory cells is divided into two separate groups/segments that each comprise two memory cells. Within each of the memory cell group, each memory cell is connected to both a first local bit line and a second local bit line via respective access switches that are activated by a corresponding word line. The first and second local bit lines are then each operatively connected to the corresponding global bit lines via respective local-to-global switches. The local-to-global switches are controlled by their own control signals that function in a similar way to the word lines in a non-hierarchical memory.

Conventionally, to implement a read operation of an SRAM memory unit such as that illustrated in FIG. 3, both the local and global bit lines are generally pre-charged to a predetermined high value. The word line associated with the memory cell to be read is then driven high, and the switch control signal controlling the local-to-global switches of the memory cell group that includes the memory cell to be read is activated at approximately the same time. A differential voltage then builds on both local and global bit lines. The voltage difference is larger on the local bit lines due to the resistive coupling between local and global bit lines. Eventually the voltage difference on the global bit lines is large enough for reliable sensing by the sense amplifier, and the sense amplifier connected to the global bit lines can read the data value stored in the memory cell. The word line can then be deactivated, with the switch control signal also being deactivated at around the same time.

Alternatively, the local bit lines of each memory cell group could be connected to a local sense amplifier that senses the voltage difference on the local bit lines, with the output of the local sense amplifier being connected to the global bit lines, such that voltages that correlate to those present on the local bit lines are then applied to the global bit lines by the local sense amplifier. Using a local sense amplifier instead of simply using a switch has a buffering (or amplifying) effect on the local bit line signals at the cost of additional circuitry and silicon area.

The aim of the hierarchical bit line circuit is to reduce the total active capacitance due to the bit lines during a memory access, and consequently to reduce power dissipation and increase operating speed. Each memory cell connected to a bit line has a loading capacitance due to the presence of the pass transistor that makes the connection to the respective bit line. For the case of a single bit line pair that connects to all memory cells in a column, the total capacitance can become large, whilst in a hierarchical bit line arrangement each local bit line only sees a fraction of this load. The global bit line is loaded by the switches/local sense amplifier that connects the local and global bit lines, and each of these may have a larger capacitive load than an individual memory cell, but the global bit line connects to a small number of these rather than to all the memory cells directly, and so also has a smaller capacitive load than a single long bit line.

Consequently, when determining if an offset adjustment should be applied to a sense amplifier of an SRAM memory unit that has a hierarchical bit line arrangement, voltages that correspond to the voltages present on the first and second local bit lines are applied to first and second global bit lines, and the sense amplifier is then used to sense a voltage difference between the first and second global bit lines. For example, if the first and second local bit lines are connected to the first and second global bit lines respectively by respective local-to-global switches or local sense amps, then this would involve activating the local-to-global switches in order to connect the first and second local bit lines to the first and second global bit lines respectively. The first time and the second time would then be measured from the point at which the local-to-global switches are activated (i.e. when the first and second local bit lines are connected to the first and second global bit lines). As an alternative example, if the first and second local bit lines are connected to a local sense amplifier, then this would involve using the local sense amplifier to sense a voltage difference between the first and second local bit lines and applying correlating/corresponding voltages to the first and second global bit lines. In this case, the first time and the second time would then be measured from the point at which correlating voltages are applied to the first and second global bit lines.

When determining if an offset adjustment to a should be applied to a global sense amplifier of an SRAM memory unit that has a hierarchical bit line arrangement, the process could involve measuring the time taken to read both a first data value and a second data value by the global sense amplifier via each of a plurality of local sense amplifiers. For example, if we consider an SRAM memory unit in which a column of the SRAM memory unit includes eight memory cell groups each of which has its own local sense amplifier that connects to the global bit lines (i.e. such that the memory cells within each memory cell group are connected to a pair of local bit lines and the local bit lines of each memory cell group are connected to the local sense amplifier associated with the memory cell group), then the global sense amplifier connected to the global bit lines could be used to read both a first data value and a second data value that has been stored within eight of the memory cell groups.

By monitoring the time taken to read both the first data value and the second data value for each of the memory cell groups, a time difference can then be calculated for each combination of the global sense amplifier with each of the local sense amplifiers, as doing so would provide an indication of the combined offset of the global sense amplifier with each of the local sense amplifiers. An algorithm could then be used to determine a "best fit" for the offset adjustment that should be applied to the global sense amplifier in dependence upon the difference between the first time and the second time measured for each combination of the global sense amplifier and a local sense amplifier. For example, in a simplistic approach, the algorithm could merely determine the average or mean time difference when measurements are taken across a number of combinations of the global sense amplifier with a number of local sense amplifiers, and use this average or mean to determine if an offset adjustment is to be applied. In this regard, those skilled in the art would be aware of how to determine a suitable offset and in particular how to use an algorithm to determine a suitable offset.

It is noted that each of the local sense amplifiers could have their own intrinsic offset voltages. Therefore, if the SRAM memory unit were to be provided with circuitry capable of applying an offset adjustment to each of the local sense amplifiers, the methods described above could be used to measure the time taken to read both the first data value and the second data value via a local sense amplifier (i.e. the time taken by the global sense amplifier to read both the first data value and the second data value based on the voltages applied to the global bit lines by the local sense amplifier), and these times could then also be used to determine if an offset adjustment should be applied to the local sense amplifier. However, it is noted the complexity and cost of implementing offset adjustment for each of the local sense amplifiers is likely to outweigh the benefit.

In one embodiment, the process of determining if an offset adjustment should be applied to a sense amplifier can involve implementing the read of the first data value and the read of the second data value as part of a "test" operation. A test operation would involve actively implementing a step of storing the data value in a memory cell that is available to be used for calibrating the sense amplifier, and then implementing a test read of this memory cell in order to measure the time taken to validly read the data value. For example, for an SRAM memory unit that includes a plurality of memory cells, a first subset of the plurality of memory cells can be actively involved in storing data as part of the memory units conventional operation /intended functionality, whilst a second subset could be allocated for implementing test operations that are separate from the conventional operation of the memory unit. In this regard, some SRAM memory units are provided with spare/backup columns of memory cells that are available for use in place of columns that are considered faulty (e.g. by error detection circuitry provided as part of the memory unit). Consequently, the memory cells within any redundant columns (i.e. backup or faulty) that are not actively being used to store data but are otherwise fully functional can be used to implement test read operations.

Alternatively, test operations could be implemented during or immediately after the initial start-up of the SRAM memory unit, when the memory cells are empty and not yet in use. The SRAM memory unit could be configured to implement an initial calibration mode in which test reads are used to determine if any offset adjustment of the sense amplifiers(s) is required.

As a further alternative, the process of determining if an offset adjustment should be applied to a sense amplifier can involve measuring the time taken to read a first data value and the time taken to read a second data value during the conventional operation of the SRAM memory unit, rather than implementing this as separate test operations. This would involve monitoring a sense amplifier whilst implementing read operations of the data stored in the SRAM memory unit in order to measure and then store the time taken for the sense amplifier to read the both possible data values (i.e. both 1's and 0's). Provided that the sense amplifier has read sufficient numbers of both 1's and 0's then the stored times can be compared to determine if there is a sufficient difference to justify applying an offset adjustment. Implementing the process in this way would allow the sense amplifiers to be monitored in real-time and enable any drift in the offset behaviour to be detected by comparing the stored times on the fly.

The above described methods provide a method by which it can be determined if an offset adjustment should be applied to a sense amplifier of an SRAM memory unit. In doing so, these methods enable SRAM memory units to be calibrated/adjusted to counter any significant offset. Moreover, these methods can even be used for SRAM memory units that have a hierarchical bit line arrangement.

Furthermore, as the methods described herein are non-invasive and can be carried out at any time during memory 'stand-by' periods, the process can also be used to dynamically adjust sense amplifier offset voltage due to the effects of process variation, supply voltage change, or temperature (PVT). The ability to undertake either 'calibrated' or 'on-the-fly' adjustments of circuit performance enables memory adjustments to be applied according to the environmental conditions prevailing in equipment service.

Figure 6:
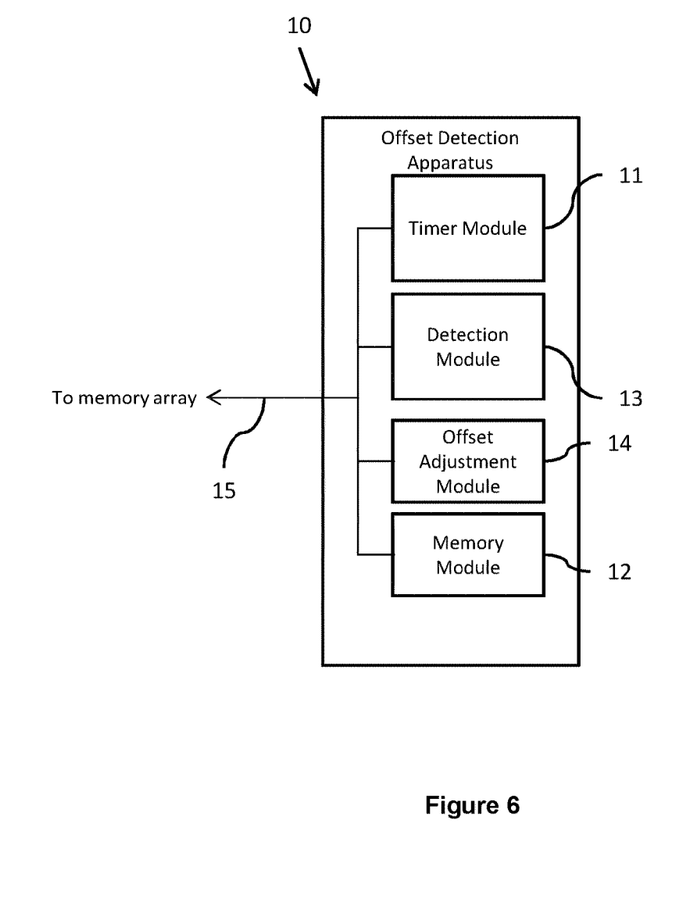
FIG. 6 illustrates schematically an embodiment of an offset detection apparatus suitable for implementing the methods described herein.

FIG. 6 illustrates schematically an embodiment of an offset detection apparatus 10 suitable for implementing the methods described herein. The apparatus 10 comprises a timer module 11, a memory module 12, an detection module 13, an offset adjustment module 14, and an interface 15 to the memory array of an SRAM memory unit. These modules of the offset detection apparatus 10 can be suitably configured to implement any of the processes described above. In particular, the timer module 11 is configured to implement the measurement of the time taken by a sense amplifier of the SRAM memory unit to read both a '1' and a '0' via the interface 15 with the memory array. The memory module is configured to store the time measurements made by the timer module. The detection module 14 is configured to calculate a difference between the times taken by the sense amplifier to read both a '1' and a '0' (i.e. the first time and the second time) and to determine that an offset adjustment should be applied to the sense amplifier in dependence upon the difference between the first time and the second time. For example, the detection module could be configured to compare the calculated difference with a threshold stored in the memory module 12, and to determine that an offset adjustment should be applied to the sense amplifier if the calculated difference exceeds the threshold. The offset adjustment module 14 is then configured to cause an offset adjustment to be applied to the sense amplifier. To do so, the offset adjustment module 14 can be configured to determine the adjustment in dependence upon the magnitude of the difference calculated by the detection module 13.

The offset detection apparatus 10 could be provided as part of an SRAM memory unit. For example, the modules of the offset detection apparatus 10 could be provided by circuitry within an SRAM memory unit component. Alternatively, the offset detection apparatus 10 could be implemented by a computer system implementing suitable software. This software could be provided on a computer readable medium storing computer interpretable instructions which when interpreted by the computer system cause the computer system to perform the methods described herein.

In this regard, a computer would typically comprise a memory, a processor and an interface. The memory of the computer would therefore be configured to store the programs/executable files that provide the functionality of the detection module 13 and the offset adjustment module 14 of the offset detection apparatus 10, and to provide memory module 12 of the offset detection apparatus. The processor of the computer would therefore be configured to execute programs/executable files that provide the functionality of the detection module 13 and the offset adjustment module 14 of the offset detection apparatus 10, and to thereby implement any of the processes described above. The interface would then be configured to communicate with the SRAM memory unit in order to send instructions to, and to receive responses and information from, the SRAM memory unit.

It will be appreciated that individual items described above may be used on their own or in combination with other items shown in the drawings or described in the description and that items mentioned in the same passage as each other or the same drawing as each other need not be used in combination with each other. In addition, the expression "means" may be replaced by actuator or system or device as may be desirable. In addition, any reference to "comprising" or "consisting" is not intended to be limiting in any way whatsoever and the reader should interpret the description and claims accordingly.

Furthermore, although the invention has been described in terms of preferred embodiments as set forth above, it should be understood that these embodiments are illustrative only. Those skilled in the art will be able to make modifications and alternatives in view of the disclosure which are contemplated as falling within the scope of the appended claims. For example, those skilled in the art will appreciate that the above-described invention might be equally applicable to other types of memory. In particular, whilst the above embodiments have been described in relation to SRAM memory units, those skilled in the art will be able to extend the above described methods other types of circuits.

The invention claimed is:

1. A method of detecting offset in a global sense amplifier of an SRAM memory unit, the method comprising:
   using the global sense amplifier of the SRAM memory unit to implement a read of a first data value stored in a memory cell of the SRAM memory unit, and measuring a first time for the global sense amplifier to read the first data value (A2);
   using the global sense amplifier to implement a read of a second data value stored in a memory cell of the SRAM memory unit, and measuring a second time for the global sense amplifier to read the second data value (A3);
   calculating a difference between the first time and the second time;
   determining that an offset adjustment should be applied to the global sense amplifier in dependence upon the difference between the first time and the second time; and
   wherein each memory cell is connected to both a first local bit line (LBL) and a second local bit line (LBL~) via respective access switches that are activated by a corresponding word line (WL0, WL1, WL2, WL3), the first and second local bit lines (LBL, LBL~) are each operatively connected to corresponding first and second global bit lines (GBL, GBL~) via respective local-to-global switches or a local sense amplifier.

2. The method of claim 1, wherein the first data value is any of a '1' and a '0' and the second data value is the other of a '1' and a '0'.

3. The method of claim 1, wherein the step of using the global sense amplifier to implement a read comprises:
   connecting the memory cell to be read to a pair of complementary bit lines; and
   using the global sense amplifier to sense a voltage difference between the complementary bit lines.

4. The method of claim 3, wherein the complementary bit lines comprise the first local bit line (LBL) and the second local bit line (LBL~), the first and second local bit lines being operatively connected to the global sense amplifier via respective first and second global bit lines (GBL, GBL~), and the step of using the global sense amplifier to sense the voltage difference between the complementary bit lines comprises applying voltages to the first and second global bit lines (GBL, GBL~) that correspond to voltages present on the first and second local bit lines (LBL, LBL~) respectively and using the global sense amplifier to sense a voltage difference between first and second global bit lines (GBL, GBL~).

5. The method of claim 4, wherein the step of applying voltages corresponding to voltages present on the first and second local bit lines (LBL, LBL~) to the first and second global bit lines (GBL, GBL~) respectively comprises connecting the first and second local bit lines to the first and second global bit lines (GBL, GBL~) respectively, wherein the first time and the second time are measured from the point at which the first and second local bit lines (LBL, LBL~) are connected to the first and second global bit lines (GBL, GBL~).

6. The method of claim 4, wherein the step of applying voltages corresponding to voltages present on the first and second local bit lines (LBL, LBL~) to the first and second global bit lines (GBL, GBL~), respectively comprises using the local sense amplifier to sense a voltage difference between the first and second local bit lines (LBL,LBL~) and applying correlating/corresponding voltages to the first and second global bit lines (GBL, GBL~), wherein the first time and the second time are measured from the point at which correlating/corresponding voltages are applied to the first and second global bit lines (GBL, GBL~).

7. The method of claim 1, wherein the SRAM memory unit comprises a plurality of memory cells, a first subset of the plurality of memory cells being available to store data and a second subset of the plurality of memory cells being available to implement first and second test read operations, and wherein the memory cell used to store the first data value and the memory cell used to store the second data value being part of the second subset.

8. The method of claim 7, wherein the first and second test read operations are implemented when the SRAM memory unit is in a calibration mode.

9. The method of claim 8, and further comprising applying an offset adjustment to the global sense amplifier.

10. The method of claim 9, wherein the SRAM memory unit has a hierarchical bit line arrangement and the offset adjustment is applied to both the local sense amplifier associated with the memory cell used for the first and second test read operations and the global sense amplifier.

11. The method of claim 9, wherein the step of determining that the offset adjustment should be applied to the global sense amplifier in dependence upon the difference between the first time and the second time comprises comparing the calculated difference with a threshold (A5-1), and determining that the offset adjustment should be applied to the global or local sense amplifier if the calculated difference exceeds the threshold (A5-2, A5-3).

12. The method of claim 11, wherein the threshold is determined based on a minimum offset adjustment that can be applied to the global sense amplifier.

13. The method of claim 1, wherein, when it is determined that the offset adjustment should be applied to the global sense amplifier, the offset adjustment is determined in dependence upon the magnitude of the calculated difference.

14. The method of claim 1, and further comprising:
for each of two or more local sense amplifiers of the SRAM memory unit that are operatively connected to the global sense amplifier, using the global sense amplifier to implement the read of a first data value and the read of a second data value via the local sense amplifier and measuring the first time for the global sense amplifier to read the first data value and the second time for the global sense amplifier to read the second data value; and
determining that an offset adjustment should be applied to the global sense amplifier in dependence upon the difference between the first time and the second time measured for each of two or more local sense amplifiers.

15. The method of claim 14, wherein the step of determining that an offset adjustment should be applied to the global sense amplifier in dependence upon the difference between the first time and the second time measured for each of one or more local sense amplifiers comprises using the time difference measured for each of two or more local sense amplifiers to determine a representative time difference and using the representative time difference to determine the offset adjustment to be applied.

16. The method of claim 15, wherein the representative time difference is any of an average and a mean of the time difference measured for each of two or more local sense amplifiers.

17. An apparatus for detecting offset in a sense amplifier of an SRAM memory unit, the apparatus comprising:
a timer module configured to measure a first time for the global sense amplifier to read a first data value stored in a memory cell of the SRAM memory unit, and to measure a second time for the global sense amplifier to read a second data value stored in a memory cell of the SRAM memory unit;
a memory module configured to store the first time and the second time measured for the global sense amplifier; and
a detection module configured to calculate a difference between the first time and the second time; and to determine that an offset adjustment should be applied to the global sense amplifier in dependence upon the difference between the first time and the second time.

18. The apparatus of claim 17, wherein the detection module is configured to compare the calculated difference with a threshold, and to determine that the offset adjustment should be applied to the global sense amplifier if the calculated difference exceeds the threshold.

19. The apparatus of claim 18, and further comprising an offset adjustment module configured to cause the offset adjustment to be applied to the global sense amplifier.

20. The apparatus of claim 19, wherein the offset adjustment module is configured to determine the adjustment in dependence upon the magnitude of the calculated difference.

* * * * *